(12) United States Patent
Nagel et al.

(10) Patent No.: US 12,739,983 B2
(45) Date of Patent: Sep. 15, 2026

(54) OPERATING DEVICE INTENDED TO BE INSTALLED IN A VEHICLE

(71) Applicant: BEHR-HELLA THERMOCONTROL GMBH, Lippstadt (DE)

(72) Inventors: Dirk Nagel, Lippstadt (DE); Matthias Stallein, Lippstadt (DE)

(73) Assignee: BEHR-HELLA THERMOCONTROL GMBH, Lippstadt (DE)

( * ) Notice: Subject to any disclaimer, the term of this patent is extended or adjusted under 35 U.S.C. 154(b) by 412 days.

(21) Appl. No.: 17/921,246

(22) PCT Filed: Apr. 26, 2021

(86) PCT No.: PCT/EP2021/060839
§ 371 (c)(1),
(2) Date: Oct. 25, 2022

(87) PCT Pub. No.: WO2021/219550
PCT Pub. Date: Nov. 4, 2021

(65) Prior Publication Data

US 2023/0104023 A1 Apr. 6, 2023

(30) Foreign Application Priority Data

Apr. 30, 2020 (DE) .................... 10 2020 111 839.2

(51) Int. Cl.
*G05G 1/02* (2006.01)
*H01F 7/20* (2006.01)
*H05K 5/00* (2006.01)

(52) U.S. Cl.
CPC ............ *H05K 5/0017* (2013.01); *G05G 1/02* (2013.01); *H01F 7/206* (2013.01); *H01F 2007/208* (2013.01)

(58) Field of Classification Search
CPC .................................................. H05K 5/0017
(Continued)

(56) References Cited

U.S. PATENT DOCUMENTS 5,896,076 A * 4/1999 van Namen .......... H01F 7/1615 335/229
6,078,308 A * 6/2000 Rosenberg ........... G06F 3/0482 345/163
(Continued)

FOREIGN PATENT DOCUMENTS

CN 106537541 A 3/2017
CN 107710619 A 2/2018
(Continued)

OTHER PUBLICATIONS

International Search Report (PCT/ISA/210) issued in PCT Application No. PCT/EP2021/060839 dated Jul. 19, 2021 with English Translation.

(Continued)

*Primary Examiner* — Alexander Talpalatski
(74) *Attorney, Agent, or Firm* — BakerHostetler

(57) ABSTRACT

The operating device (10,10') intended to be installed in a vehicle is provided with a housing (12) and an operating element (14,14') which is movably mounted in and/or on the housing (12) and can be manually transferred from a rest position to a function-triggering position. Furthermore, the operating device (10, 10') is provided with a switch (22) which is adapted to be actuated by the operating element (14, 14') when it is manually transferred to the function-triggering position, a holding-force generation unit (26, 26') for generating a holding force with which the operating element (14, 14') is held in its rest position, and a control unit (32) for electrically controlling the holding-force generation unit for the purpose of setting the holding force.

10 Claims, 2 Drawing Sheets

Figure 1:
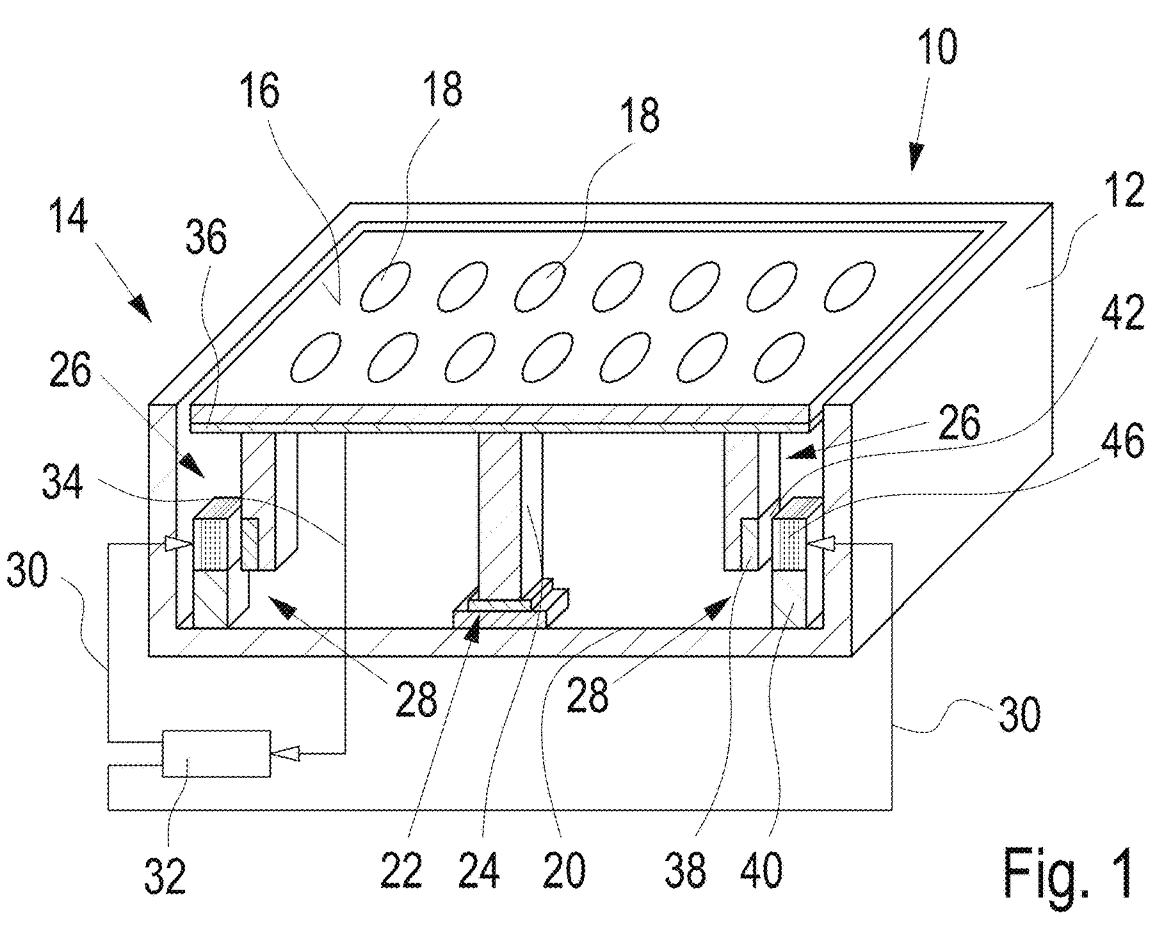

(58) Field of Classification Search
USPC .......................................................... 335/229
See application file for complete search history.

(56) References Cited

U.S. PATENT DOCUMENTS

| | | | | |
|---|---|---|---|---|
| 6,118,435 | A * | 9/2000 | Fujita | G06F 3/016 345/173 |
| 7,769,417 | B2 * | 8/2010 | Tierling | G06F 3/016 345/157 |
| 8,072,418 | B2 * | 12/2011 | Crawford | H02K 49/10 345/184 |
| 8,264,465 | B2 * | 9/2012 | Grant | G06F 3/016 345/173 |
| 8,927,890 | B2 * | 1/2015 | Peterson | H03K 17/962 200/600 |
| 9,928,950 | B2 * | 3/2018 | Lubinski | H01F 41/02 |
| 10,232,714 | B2 * | 3/2019 | Wachinger | H03K 17/9622 |
| 10,234,960 | B1 | 3/2019 | Bharadwaj | |
| 10,381,144 | B1 * | 8/2019 | Degner | H01F 7/1607 |
| 10,642,361 | B2 * | 5/2020 | Kessler | G06F 3/03547 |
| 11,691,513 | B2 * | 7/2023 | Stallein | G06F 3/016 335/185 |
| 2007/0285195 | A1 * | 12/2007 | Nehl | G01R 33/14 335/209 |
| 2012/0153748 | A1 * | 6/2012 | Wauke | H02K 33/16 310/25 |
| 2013/0207758 | A1 * | 8/2013 | Browne | H01F 7/0252 335/289 |
| 2018/0186304 | A1 | 7/2018 | Wachinger | |
| 2018/0194229 | A1 * | 7/2018 | Wachinger | G06F 3/03548 |
| 2018/0253157 | A1 | 9/2018 | Pankratz et al. | |

FOREIGN PATENT DOCUMENTS

| | | | | |
|---|---|---|---|---|
| CN | 107810123 | A | 3/2018 | |
| DE | 10 2008 060 256 | A1 | 6/2010 | |
| DE | 10 2011 089 400 | A1 | 6/2013 | |
| DE | 102014017577 | A1 | 6/2016 | |
| DE | 10 2015 008 571 | A1 | 1/2017 | |
| DE | 102015009314 | A1 | 1/2017 | |
| DE | 102015008571 | B4 * | 8/2017 | B60K 35/20 |
| DE | 10 2018 202 657 | A1 | 8/2019 | |
| DE | 10 2018 212 618 | B3 | 10/2019 | |
| DE | 10 2018 217 865 | A1 | 4/2020 | |
| DE | 10 2019 201 901 | B3 | 4/2020 | |
| WO | 2007/135169 | A1 | 11/2007 | |
| WO | 2015/029335 | A1 | 3/2015 | |
| WO | 2017/001032 | A1 | 1/2017 | |
| WO | 2020/234025 | A2 | 11/2020 | |

OTHER PUBLICATIONS

Written Opinion (PCT/ISA/237) issued in PCT Application No. PCT/EP2021/060839 dated Jul. 19, 2021.

Chinese Office Action issued in Chinese Patent Application No. 202180030624.6 dated Feb. 28, 2025, with English translation.

Japanese Office Action issued in Japanese Patent Application No. 2022-565539 dated May 20, 2025, with English translation.

KR Office Action dated Sep. 19, 2025 for KR application No. 10-2022-7041054, with English translation.

* cited by examiner

OPERATING DEVICE INTENDED TO BE INSTALLED IN A VEHICLE

CROSS-REFERENCE OF RELATED APPLICATIONS

This application is the U.S. National Phase under 35 U.S.C. § 371 of International Patent Application No. PCT/EP2021/060839, filed on Apr. 26, 2021, which claims priority to German Patent Application No. 10 2020 111 839.2, filed on Apr. 30, 2020, the entire disclosures of each are incorporated by reference herein.

The present application claims the priority of the German Patent Application 10 2020 111 839.2 of Apr. 30, 2020, the contents of which are hereby incorporated by reference into the subject matter of the present application.

The invention relates to an operating device intended to be installed in a vehicle.

Operating devices intended to be installed in a vehicle are known in a wide variety of configurations. For example, such operating devices have individual depressible keys, slide switches, toggle or rocker keys and/or push/rotary adjusters. All of these operating elements have in common that a certain actuating force threshold, which has been fixed in terms of design beforehand, must be exceeded manually in order to trigger an operating function or, in the case of a rotary actuator, to continue rotating it manually.

Sometimes, however, it is desirable to be able to vary the force threshold and thus the switching torque in order to set different functions or to "personalize" operating elements, so to speak. In this way, it is possible, for example, to install operating element designs in operating devices for the vehicles of different vehicle manufacturers, wherein each vehicle manufacturer can then define the force thresholds and thus the switching torques differently in accordance with its "operating philosophy".

In the case of operating elements adjustable in a latching manner, such as a rotary adjuster, it is already known to magnetically adjust and change the force with which a latching projection slides from latching position to latching position on a latching guideway. Such an operating element with haptics that can be adjusted to this extent is known from DE-A-10 2008 060 256. In such purely mechanical latching devices, the latching positions cannot be changed. For this purpose, it is known from WO-A-2007/135169, for example, that the latching positions can be designed such that hey can be varied by means of an electric motor by coupling the rotary adjuster to the armature shaft of an electric motor which is supplied with current in adjustable rotary positions in order to be able to selectively adjust the position of holding positions and the force with which the armature is held in these holding positions.

From DE-A 10 2018 217 865, an operating device with a compensating weight is described that supports the return movement of the depressed operating element to its initial position after it has been actuated.

From DE-A-10 2011 089 400 and DE-B-10 2019 201 901, further operating elements having various kinematics for motor vehicles are known.

Finally, the previously filed patent application republished as WO-A-2020/234025 shows an operating unit for a vehicle in which the device holding the operating element in its rest position has a holding magnet.

It is an object of the present invention to provide a simple concept for an operating device intended to be installed in a vehicle, in which the operating element(s) can be varied in a simple manner with regard to their force threshold(s) to be overcome manually.

The object of the present invention is achieved by proposing an operating device intended to be installed in a vehicle, the operating device being provided with

- a housing;
- an operating element which is movably mounted in and/or on the housing and can be manually transferred from a rest position to a function-triggering position,
- a switch which can be actuated by the operating element when the operating element is manually transferred to the function-triggering position,
- a holding-force generation unit for generating a holding force by means of which the operating element is held in its rest position, and
- a control unit for electrically controlling the holding-force generation unit for the purpose of setting a maximum holding force which can be lowered when the operating element is contacted in order to produce the haptics typical of operating an operating element.

The operating element according to the invention comprises at least one operating element which is movably mounted in and/or on the housing and can be manually transferred from a rest position to a function-triggering position. The operating element is associated with a switch which can be actuated by the operating element when the operating element is manually transferred to the function-triggering position. The switch can operate purely mechanically but can also be configured as an optical, capacitive or inductive switch. Each operating element is associated with a holding-force generation unit with which the holding force by means of which the operating element is held in its rest position can be adjusted. The holding-force generation unit thus determines the force threshold that must be overcome manually for valid actuation of the operating element; the holding-force generation device therefore does not lead to a fundamental blocking of the operating element, which consequently can still be depressed, for example, when the force threshold is exceeded by manual actuation, but which is not fundamentally intended for actuation of the operating element in this way. The one or more holding-force generation units are associated with a control unit that generates an electrical control signal for each holding-force generation unit, the electrical control signal defining the set holding force.

With the concept according to the invention, it is now possible to specify a different force threshold for each of several operating elements, which must be manually overcome in order to validly actuate the corresponding operating element. Thus, an operating device intended to be installed in a vehicle can be personalized, so to speak. However, in particular the force thresholds of the operating elements can be specified differently depending on the menu. Finally, however, the dynamics with which the operating element can be actuated can also be set by means of the control unit and the holding-force generation unit. In other words, the force-displacement characteristic of an operating element can be changed not only statically but also dynamically.

In an advantageous embodiment of the invention, it may be provided that the holding-force generation unit comprises an electromagnet having a stator with an electric coil and an armature, and that the control unit for controlling the electric coil of the electromagnet is connected to the electric coil. By means of an electromagnet, the force threshold can be defined in a particularly advantageous and simple way, for example by means of the magnitude of the coil current and/or the air gap between stator and armature and/or by means of the extent to which the magnetically effective surfaces of stator and armature overlap. For the size and adjustability of the force threshold, the fact in which direction relative to each other the stator and armature move can also play a role when the set force threshold is overcome. Thus, the stator and armature can move further away from each other at this moment, thus changing the air gap, or the air gap remains the same and the stator and armature move transverse to their distance extension.

In the previously described example of the electromagnet, a coil current, i.e. the application of electrical energy, is required to define the holding force in the rest position of the operating element. In this respect, it is advantageous if no electrical energy is required to apply the holding force with the possibility of adjusting the same. In an advantageous further development of the invention, a permanent holding electromagnet can be used as a holding-force generation unit. In such a holding magnet, the magnetic holding force is provided by the magnetic flux generated by the permanent magnet. Here, it is also possible to adjust this holding force, for example, by means of the size of the air gap in the magnetic circuit. It is also possible to adjust the holding force by selecting the permanent magnet. By applying current to the electric coil of the permanent magnet, the magnetic flux generated by the permanent holding electromagnet is cancelled out so that the holding force can be adjusted thereby. Finally, it is also possible to use a (pure) permanent magnet as the holding-force generation unit. Here, the holding force can then be adjusted by design or by selecting the permanent magnet.

In a further advantageous embodiment of the invention, the operating device can comprise a contact sensor system for detecting a contacting of the operating element, the contact sensor system outputting a sensing signal to the control unit when contacting of the operating element is detected, and the control unit then controlling the holding-force generation unit to set a desired holding force acting in the rest position of the contacted operating element. In this way, a holding force can be specified in the rest position of the operating element, which is only set to the desired level (typically by lowering) at the moment when contacting of the operating element is detected. This prevents the operating element from "rattling" without having to overcome excessive forces when operating the operating element manually.

In a further advantageous embodiment of the invention, it is provided that the operating element comprises an operating surface having several operating panels, that the contact sensor system outputs different sensing signals to the control unit depending on the operating panel for which a contact is detected, and that the control unit controls the holding-force generation unit by means of different control signals depending on the different sensing signals for the purpose of generating different holding forces. Depending on which operating panel is contacted, the force threshold with which the operating element must be depressed to activate the function that can be triggered with the corresponding operating panel can vary in magnitude. Depending on which operating menu is displayed on the operating surface of the operating element, said holding force can also have the same magnitude for each of the operating panels and can have a different or the same magnitude from operating menu to operating menu. The (typically) lowering of the holding force when contacting the operating element can therefore be different in magnitude for different operating panels of one and the same operating menu, or can be the same for all operating panels of the operating menu and different from operating menu to operating menu for the respective operating panels, or can be a combination of both. Typically, the holding force is great enough when the operating element is not contacted, so that a rattling or an unintentionally strong and forceful contacting of the operating element does not immediately trigger an operating function.

In addition to the use of magnetically effective holding-force generation units, these can also have a magnetorheological or an electropolymeric holding-force element (see, for example, DE-B-10 2018 212 618), wherein these types of holding-force elements can in turn be controlled with electrical control signals that can be generated by the control unit of the operating unit according to the invention. Such holding-force elements can be configured as e.g. mechanical blocking elements as well as in a "solidified" state impede a movement of the operating element or an element kinematically coupled thereto, while they are/become flexible when the force thresholds are overcome. This is because magnetorheological polymers or fluids can change their stiffness or mobility under the influence of an externally applied magnetic field, as is the case with electroactive polymers when electrical voltages are applied. Alternatively or additionally, such blocking elements can also operate pneumatically or hydraulically. For example, the mobility of particles or elements that can be brought into positive locking in a casing or similar enclosure can be influenced by pneumatically or hydraulically applied negative pressure.

As already described above, the at least one operating element, which is electrically adjustable with respect to its force threshold within the scope of the operating device according to the invention, can be guided linearly and thus be translationally movable from the rest position to the function-triggering position. Such an operating element is configured as a key, for example, and can thus be displaced vertically, or is configured as a slide switch, wherein the operating element can then be displaced laterally.

As an alternative to the above-described concept of the at least one operating element, said operating element can also be tiltable or pivotable and thus be transferable from the rest position to the function-triggering position by tilting or pivoting. In such constructions, the holding force can additionally be influenced by the selected leverage force ratio.

As already described above, the switch can be a mechanical switch or a switch operating without contact, for example a switch operating in an optical, capacitive or inductive manner. If a mechanical switch is used, its haptics are used in addition to the haptics generated by the holding force set according to the invention. In the case of non-mechanical switches, the haptics can then be realized solely by the holding-force generation unit provided according to the invention.

The return movement of the actuated operating element to its rest position can be spring-supported or supported by compensating weights, or can be effected by the restoring ability of a switch actuated when the operating element is depressed, for example, or the like. Here, different approaches exist. Different concepts are therefore conceivable in the exemplary embodiments described here. Finally, the holding-force generation device and the magnetic force it typically employs can also be used to "pull" the operating element back to the rest position.

Figure 2:
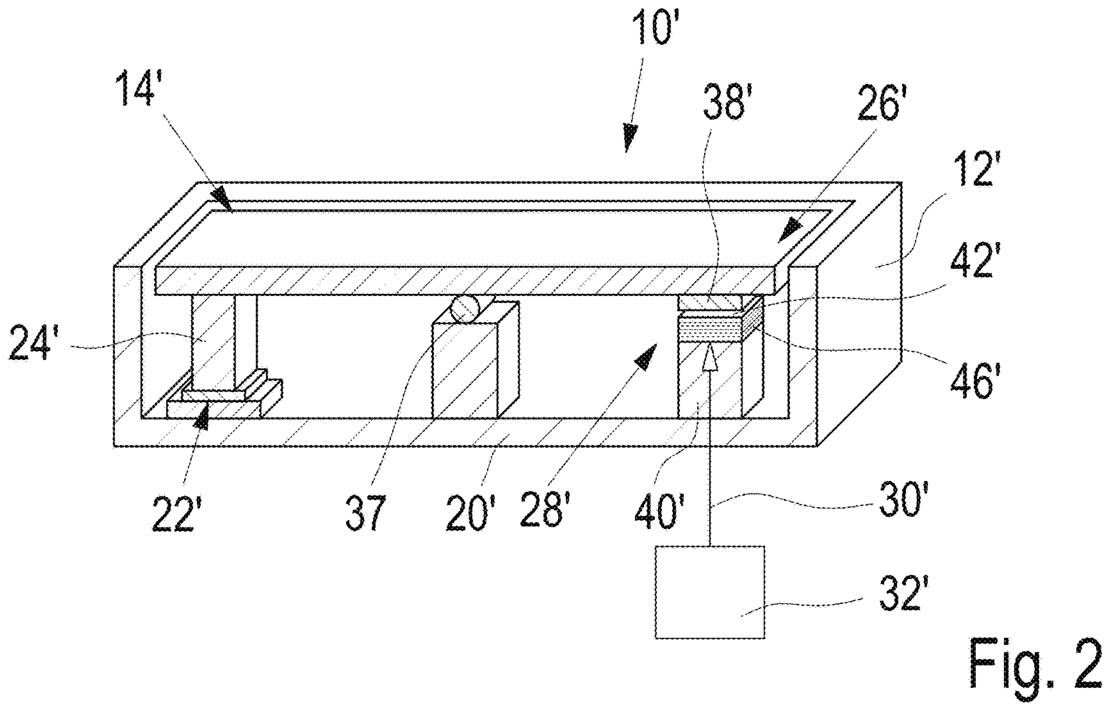
Figure 3:
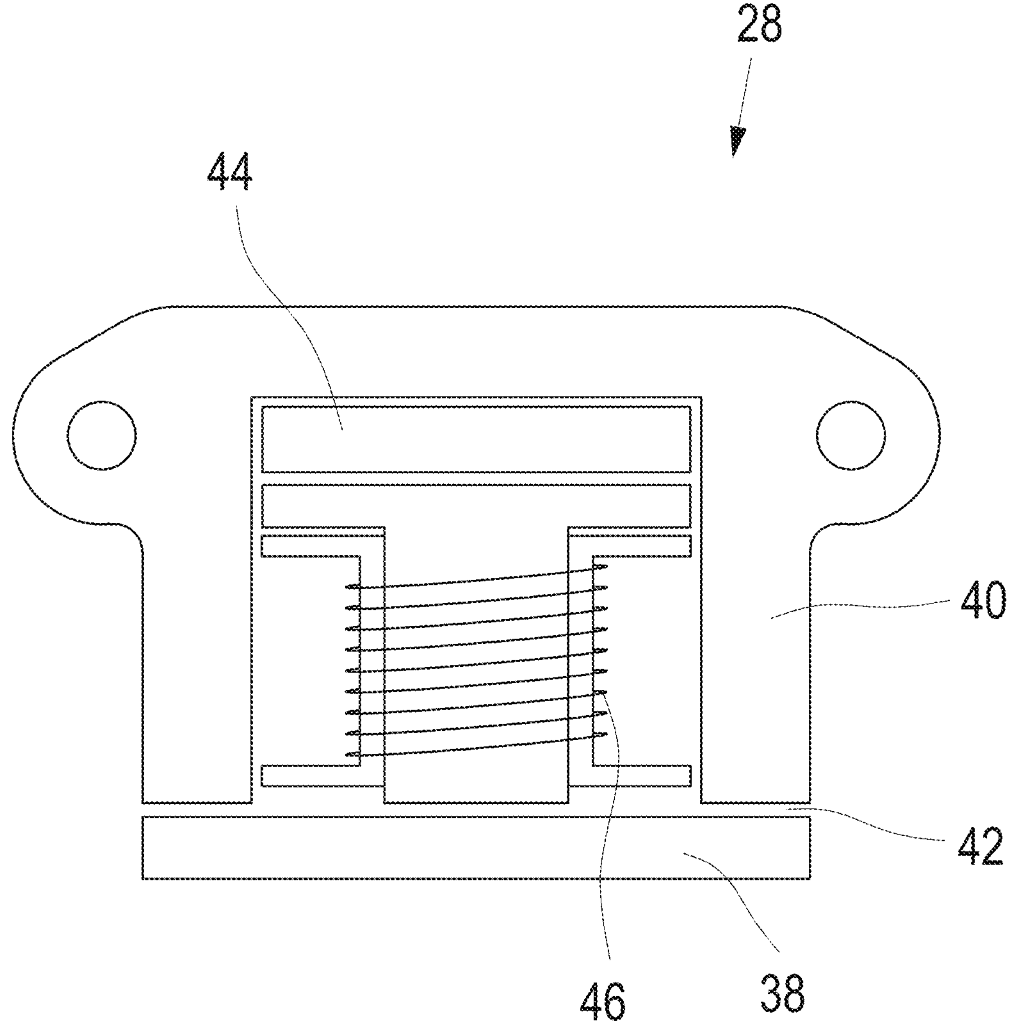

The invention is explained in more detail below by means of two exemplary embodiments and with reference to the drawing. In the Figures:

FIG. 1 schematically shows a first exemplary embodiment of an operating device having a depressible operating element configured as a touchscreen, FIG. 2 shows a second exemplary embodiment of an operating device having a toggle switch, and FIG. 3 shows a schematic illustration of a permanent holding electromagnet.

FIG. 1 is a sectional and perspective view of an operating device 10 intended to be installed in a vehicle, comprising a housing 12 having an operating element 14. In this exemplary embodiment, the operating element 14 is configured as a touchscreen forming an operating surface 16 on which several operating panels 18 are displayed. On the bottom 20 of the housing 12, for example, there is a mechanical switch 22, for example, which is actuated by means of a plunger 24 which in turn projects from the operating element 14 towards the bottom 20. In the rest position shown in FIG. 1, the operating element 14 is held by means of a holding-force generation unit 26 comprising two permanent holding electromagnets 28 in this exemplary embodiment. However, a single such permanent holding electromagnet 28 is also sufficient. In addition to a permanent magnet, such a permanent holding electromagnet 28 (see e.g. FIG. 3) also has an electric coil. The electric coil is controlled with the aid of an electric control signal 30 generated by a control unit 32. In this exemplary embodiment, the control unit 32 is also provided with a sensing signal 34 of the contact sensor system 36 of the touchscreen.

In FIG. 1, the structure of the operating device 10 is shown purely schematically. For reasons of clarity, for example, the illustration of the linear guidance of the operating element 14 for depressing the same is not shown.

The holding force in the rest position of the operating element 14 shown in FIG. 1 is generated by the two permanent electromagnets 28 of the holding-force generation unit 26. Here, the size of the air gaps and the selection of the permanent magnets play a role. When the operating surface 16 is contacted in the area of one of the operating panels 18, a control signal 30 is sent to the electric coils of the permanent holding electromagnets 28 by means of the control unit 32, so that their force threshold adjusts to the level that is desired and must be manually overcome in order to depress the operating element 14. When depressing the operating element 14, the switch 22 is then actuated.

FIG. 2 shows a modified concept of an operating device 10' with an alternatively configured operating element 14'. The operating element 14' is designed as a toggle key and has a tilt or pivot bearing 37, respectively. Insofar as the elements of the operating device 10' of FIG. 2 being essential for the invention are structurally or functionally comparable with the elements of the operating device 10 of FIG. 1, they are provided in FIG. 2 with the same reference numerals, but marked with a single prime.

The holding-force generation unit 26' of the operating device 10' of FIG. 2 in turn has a permanent holding electromagnet 28'. The tilting or pivoting design of the operating element 14' can now influence the holding force of the rest position of the operating element 14' shown in FIG. 2 if the lever ratios are selected accordingly, thus providing a further degree of freedom.

The use of a permanent holding electromagnet 28 shown schematically in FIG. 3 as the holding-force generation unit 26 is also advantageous in that, in the holding position, the movable armature 38 and the stationary stator 40 of the holding magnet do not contact each other but remain separated from each other by a minimum air gap 42, for example. The gap 42 could also be filled by mechanically steaming, i.e., for example, compressible material. Thus, there is no contact between the armature 38 and the stator 40, and thus no possible mechanical force feedback to the operating surface 16, which would affect comfort. The stationary stator 40 or also the movable armature 38 is provided with a permanent magnet 44. The stator 40 further comprises a coil 46 through which current flows in order to cancel, modify, redirect or the like the magnetic field emanating from the permanent magnet 44 and affecting the position keeping of the armature 38. Indeed, if the finger of a hand is detected by means of the contact sensor system 36, which is classically a touch sensor system, the coil 46 of the permanent holding electromagnet 28 can be supplied with current and thus the holding force can be changed or even cancelled. This takes place within a few milliseconds and is thus outside the perceptible latency.

The design according to the invention thus makes it possible to conveniently implement the passive haptics concept in a simple manner. This is characterized in that a depressible operating element 14' acts on a mechanical switch 22, which has a tactilely perceptible force feedback effect on the operating element 14'. The operating element 14' has a plurality of symbol fields. The entire operating surface 16 is not always occupied with symbol fields. For example, 16 "isolated touch surfaces" may be designated on the operating surface. There is no function between these isolated surfaces. However, without a mechanical locking, the operating surface 16 may move when force is applied by a finger and thus suggest a non-existent function triggering. The controllable mechanical locking according to the invention prevents this. The locking is only released when the finger is located on designated touch surfaces. The locking can also only be released temporarily for designated touch surfaces. Thus, it can be prevented that due to previously defined operating states, for example of a vehicle, a touch surface, which is basically enabled, is rendered ineffective.

LIST OF REFERENCE NUMERALS

- 10 operating device
- 10' operating device
- 12 housing
- 12' housing
- 14 operating element
- 14' operating element
- 16 operating surface
- 18 operating panels
- 20 bottom
- 20' bottom
- 22 switch
- 22' switch
- 24 plunger
- 24' plunger
- 26 holding-force generation unit
- 26' holding-force generation unit
- 28 permanent holding electromagnet
- 28' permanent holding electromagnet
- 30 control signal
- 30' control signal
- 32 control unit
- 32' control unit
- 34 sensing signal
- 36 contact sensor system
- 37 tilt/pivot bearing
- 38 armature
- 38' armature
- 40 stator

40' stator
42 air gap
42' air gap
44 permanent magnet
46. coil
46' coil

LITERATURE

DE-A-10 2008 060 256
DE-A-10 2011 089 400
DE-B-10 2018 212 618
DE-A-10 2018 217 865
DE-B-10 2019 201 901
WO-A-2007/135169
WO-A-2020/234025

The invention claimed is:

1. An operating device intended to be installed in a vehicle, comprising:

a housing, an operating element which is movably mounted in and/or on the housing and can be manually transferred from a rest position to a function-triggering position, a switch which can be actuated by the operating element when the operating element is manually transferred to the function-triggering position, a holding-force generation unit for generating a holding force by means of which the operating element is held in its rest position, a control unit for electrically controlling the holding-force generation unit for the purpose of setting the holding force, and a contact sensor system for detecting a contacting of the operating element, the contact sensor system outputting a sensing signal to the control unit when contacting an operating panel is detected, wherein the operating element comprises an operating surface having several operating panels spaced apart from each other and defining an inactive region between the operating panels, wherein the contact sensor system only upon sensing contacting of one of the operating panels provides a sensing signal to the control unit for releasing the rest position holding force, such that the rest position holding force is only released when the contact sensor system senses contacting of one of the operating panels of the operating surface, and wherein the control unit is configured to control the holding-force generation unit to set a desired holding force acting in the rest position of the operating element when one of the operating panels is contacted, wherein the desired holding force is lower than the holding force with which the operating element is held when one of the operating panels is not contacted or before being contacted.

2. The operating device according to claim 1, wherein the holding-force generation unit comprises an electromagnet having a stator with an electric coil and an armature, and that the control unit for controlling the electric coil of the electromagnet is connected to the electric coil.

3. The operating device according to claim 2, wherein the electromagnet is configured as a permanent holding electromagnet whose stator has a permanent magnet.

4. The operating device according to claim 1, wherein the contact sensor system outputs different sensing signals to the control unit depending on the operating panel for which a contact is detected, and that the control unit controls the holding-force generation unit by means of different control signals depending on the different sensing signals for the purpose of generating different holding forces.

5. The operating device according to claim 1, wherein the holding-force generation unit comprises a magnetorheological or an electropolymeric holding-force element which is controllable by the electrical control signal of the control unit in order to set a mechanical holding force acting in the rest position of the operating element.

6. The operating device according to claim 1, wherein the operating element is linearly guided and translationally movable from the rest position to the function-triggering position.

7. The operating device according to claim 1, wherein the operating element is tiltable or pivotable and is movable from the rest position to the function-triggering position by tilting or pivoting.

8. The operating device according to claim 1, wherein the switch is a mechanical switch or a switch operating without contact.

9. The operating device according to claim 8, wherein the switch is operable in an optical, capacitive or inductive manner.

10. The operating device according to claim 1, further comprising a plunger protruding from the operating element toward the switch, wherein the plunger is configured to actuate the switch when the operating element is depressed.

* * * * *